(12) United States Patent
Lee

(10) Patent No.: US 6,287,923 B1
(45) Date of Patent: Sep. 11, 2001

(54) METHOD OF FORMING A MOS TRANSISTOR

(76) Inventor: Tzung-Han Lee, 13F-2, No. 178, Sec. 5, Min-Sheng E. Rd, Taipei City (TW)

( * ) Notice: Subject to any disclaimer, the term of this patent is extended or adjusted under 35 U.S.C. 154(b) by 0 days.

(21) Appl. No.: 09/414,900

(22) Filed: Oct. 8, 1999

(51) Int. Cl.⁷ .................................................. H01L 21/336
(52) U.S. Cl. .......................................... 438/299; 438/300
(58) Field of Search ................................... 438/299, 301, 438/303, 305, 306, 307, 595

(56) References Cited

U.S. PATENT DOCUMENTS

| | | | |
|---|---|---|---|
| 5,783,478 | * 7/1998 | Chau et al. | 438/592 |
| 5,902,125 | * 5/1999 | Wu | 438/300 |
| 6,074,921 | * 6/2000 | Lin | 438/299 |

* cited by examiner

*Primary Examiner*—David Nelms
*Assistant Examiner*—Vu David

(57) ABSTRACT

A silicon oxide layer is first formed on a silicon substrate. Then, a polysilicon layer is formed on a predetermined area of the silicon oxide layer and a first dielectric layer is formed on top of the polysilicon layer. Next, a second dielectric layer is uniformly covered on the surface of the silicon oxide layer, the polysilicon layer and the first dielectric layer. An etching back process is performed to completely remove the second dielectric layer positioned on top of the first dielectric layer and to make the second dielectric layer positioned around the periphery of the polysilicon layer and the first dielectric layer become spacers. An etching process is performed to completely remove the first dielectric layer between the spacers. An ion implantation process is performed to form two doping areas in the silicon substrate adjacent to the spacers which are respectively used as a source and a drain of the MOS transistor. A conductive layer is uniformly formed on the semiconductor wafer that fills the space between the spacers. Finally, a planarization process is performed to level off the surface of the conductive layer and to isolate the conductive layer positioned inside the spacers from that outside the spacers. The conductive layer and the polysilicon layer positioned inside the spacers are used as a gate of the MOS transistor.

12 Claims, 9 Drawing Sheets

METHOD OF FORMING A MOS TRANSISTOR

BACKGROUND OF THE INVENTION

1. Field of the Invention

The present invention relates to a method of forming a MOS transistor, and more particularly, to a method of forming a gate of the MOS transistor and a landing pad on the drain and source of the MOS transistor at the same time.

2. Description of the Prior Art

A memory cell of dynamic random access memory (DRAM) is formed by a metal oxide semiconductor (MOS) transistor, a capacitor and a node contact. The MOS transistor is used as a pass transistor of the memory cell to control the flow of charge. The capacitor is used to store the charge required for recording and recalling data. The node contact is used as a contact plug for electrically connecting the MOS transistor and the capacitor.

Please refer to FIG. 1 and FIG. 2. FIG. 1 and FIG. 2 are schematic diagrams of a method of forming a MOS transistor 25 according to the prior art. The prior art MOS transistor 25 is formed on a silicon substrate 12 of a semiconductor wafer 10. As shown in FIG. 1, a silicon oxide layer 14 is first formed on the silicon substrate 12. Then, at least one gate 16 is formed on a predetermined area of the silicon oxide layer 14. Next, an ion implantation process is performed to form two doping areas 20 in the silicon substrate 12 on two opposite sides of the polysilicon layer 16 wherein each of the two doping areas 20 is used as a lightly doped drain (LDD) of the MOS transistor 25.

Next, as shown in FIG. 2, a spacer 22 made of silicon nitride is formed around the periphery of each polysilicon layer 16. Then, an ion implantation process is performed to form two heavy doping areas 24 in the silicon substrate 12 on the two opposite sides of the spacer 22 so as to complete the MOS transistor 25. Each of the two heavy doping areas 24 is used as a drain or a source 24 of the MOS transistor 25.

However, when the pattern of semiconductor devices is reduced, it becomes more difficult to form a node contact of the DRAM using only etching and deposition processes. Therefore, in current semiconductor processing, a landing pad and another contact plug are formed to serve as the base for a shorter node contact. Forming this contact plug and landing pad prior to the formation of the shorter node contact decreases the difficulty in the whole node contact process and further ensures the electrical performance of the DRAM.

Please refer to FIG. 3 to FIG. 7. FIG. 3 to FIG. 7 are schematic diagrams of a method of forming a landing pad 38 on the semiconductor wafer 10 shown in FIG. 2. When the MOS transistor 25 is completed, a landing pad 38 can be formed on the drain or source 24. As shown in FIG. 3, a dielectric layer 26 made of silicon oxide is first formed on the semiconductor wafer 10. Then a lithographic process is performed to form a first photoresist layer 28 on the dielectric layer 26 wherein the first photoresist layer 28 comprises an opening 30 to the surface of the dielectric layer 26. Next, as shown in FIG. 4, an anisotropic etching process is performed to remove the dielectric layer 26 under the opening 30 so as to form a contact hole 32. Then, a stripping process is performed to completely remove the first photoresist layer 28.

Next, as shown in FIG. 5, a conductive layer 34 is uniformly formed on the semiconductor wafer 10 and fills the contact hole 32. Then, as shown in FIG. 6, a second photoresist layer 36 is formed on a predetermined area of the conductive layer 34 for defining the position of the landing pad 38. Finally, as shown in FIG. 7, the conductive layer 34 not covered by the second photoresist layer 36 is removed, and then the photoresist layer 36 is also removed. The top end of the conductive layer 34 protruding from the dielectric layer 26 is used as the landing pad 38 for electrically connecting a sequentially formed storage node of a capacitor. The pillar-shaped portion at the bottom of the conductive layer 34 is used as a contact plug 37 for electrically connecting the drain and source 24 positioned on the silicon substrate 12.

The formation of the MOS transistor 25 is prior to the formation of the landing pad 38 and the contact plug 37 within the contact hole 32. However, it is difficult to control the etching selection ratio of silicon nitride to silicon oxide when the etching process is performed along the opening 30 on the dielectric layer 26 to form the contact hole 32. If the position of the opening 30 is not exactly defined, the surface of the gate 16 and the spacer 22 can easily be etched, with the result that the subsequently formed contact plug 37 is too close to the gate 16, causing electrical coupling effects. Therefore, the lithographic process must be exactingly controlled when forming the opening 30 of the first photoresist layer 28 to precisely define the position of the contact hole 37, thereby ensuring the electrical performance of the DRAM. Furthermore, the lithographic process must be performed again to form the second photoresist layer 36 on the conductive layer 34 for exactly defining the position of the landing pad 30. It is believed that the whole DRAM process is too complex.

SUMMARY OF THE INVENTION

It is therefore a primary objective of the present invention to provide a method of forming a MOS transistor, which can simplify the whole DRAM process and enhance the electrical performance of the semiconductor products.

In a preferred embodiment, the present invention provides a method of forming a metal oxide semiconductor (MOS) transistor on a semiconductor wafer, the semiconductor wafer comprising a silicon substrate, the method comprising:

forming a silicon oxide layer on the silicon substrate;

forming a polysilicon layer on a predetermined area of the silicon oxide layer and a first dielectric layer on top of the polysilicon layer;

forming a second dielectric layer uniformly covered on the surface of the silicon oxide layer the polysilicon layer and the first dielectric layer;

performing an etching back process to completely remove the second dielectric layer positioned on top of the first dielectric layer and to make the second dielectric layer positioned around the periphery of the polysilicon layer and the first dielectric layer become a spacer;

performing an etching process to completely remove the first dielectric layer surrounded by the spacer;

performing an ion implantation process to form two doping areas on the silicon substrate at two opposite sides of the spacer which are respectively used as a source and a drain of the MOS transistor;

forming a conductive layer uniformly on the semiconductor wafer which fills the space inside the spacer; and performing a planarization process to level off the surface of the conductive layer and to make the conductive layer positioned inside and outside the spacer become isolated wherein the conductive layer and the polysilicon layer positioned inside the spacer are used as a gate of the MOS transistor.

It is an advantage of the present invention that the whole semiconductor process can be simplified to ensure the electrical performance of the semiconductor products.

This and other objectives of the present invention will no doubt become obvious to those of ordinary skill in the art after having read the following detailed description of the preferred embodiment which is illustrated in the various figures and drawings.

DETAILED DESCRIPTION OF THE PREFERRED EMBODIMENT

Please refer to FIG. 8 to FIG. 17. FIG. 8 to FIG. 17 are schematic diagrams of a method of forming a MOS transistor according to the present invention. The present invention provides a method of simultaneously forming a gate 57 (FIG. 17) of a MOS transistor and a landing pad 60 on a silicon substrate 42 of a semiconductor wafer 40. The MOS transistor is used as a pass transistor of a memory cell of a DRAM. The top end of the landing pad 60 is used for electrically connecting to a storage node of a capacitor of the memory cell or a bit line of the DRAM.

Figure 1:
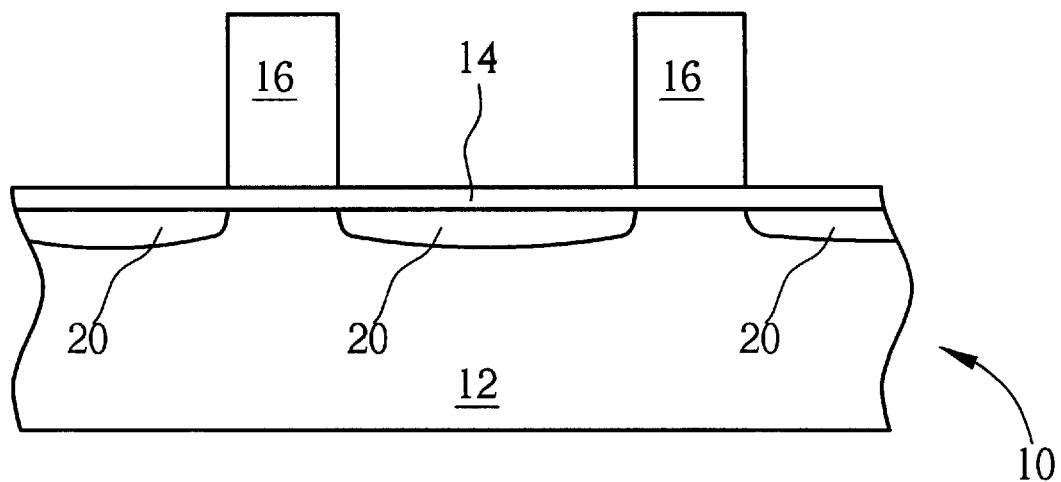
FIG. 1 and FIG. 2 are schematic diagrams of a method of forming a MOS transistor according to the prior art.
Figure 2:
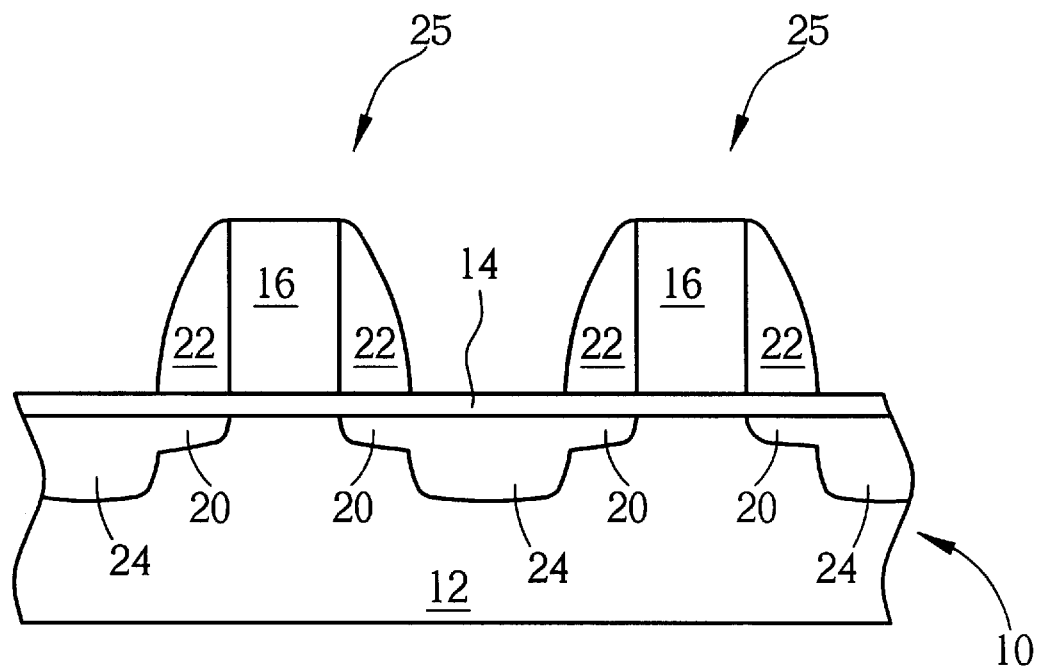
Figure 3:
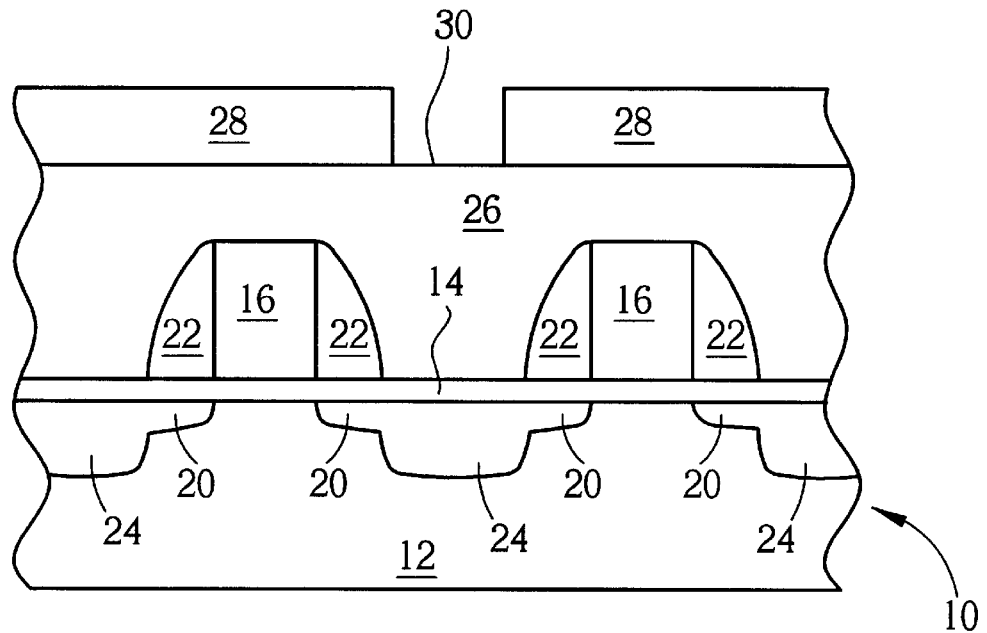
FIG. 3 to FIG. 7 are schematic diagrams of a method of forming a landing pad on the semiconductor wafer shown in FIG. 2.
Figure 4:
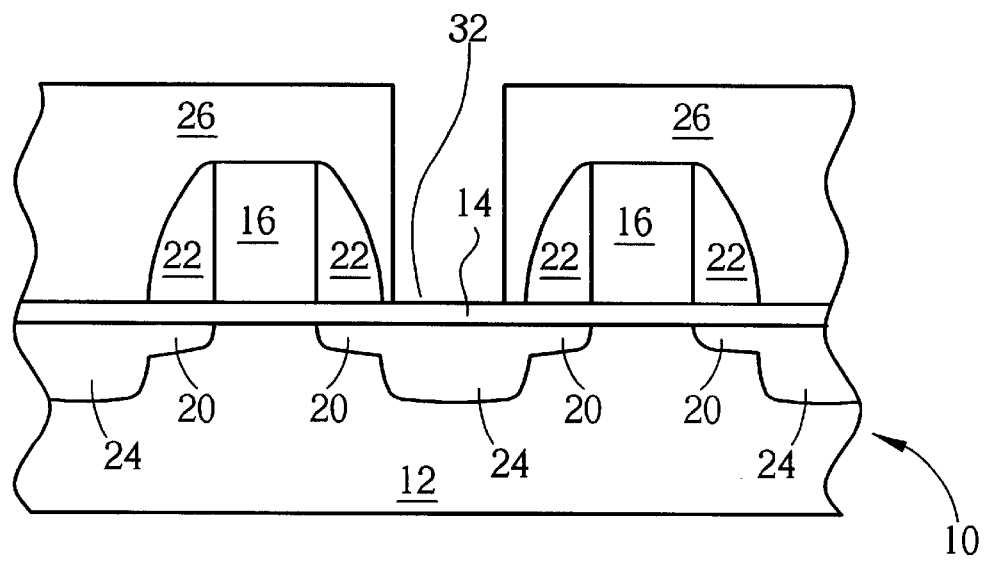
Figure 5:
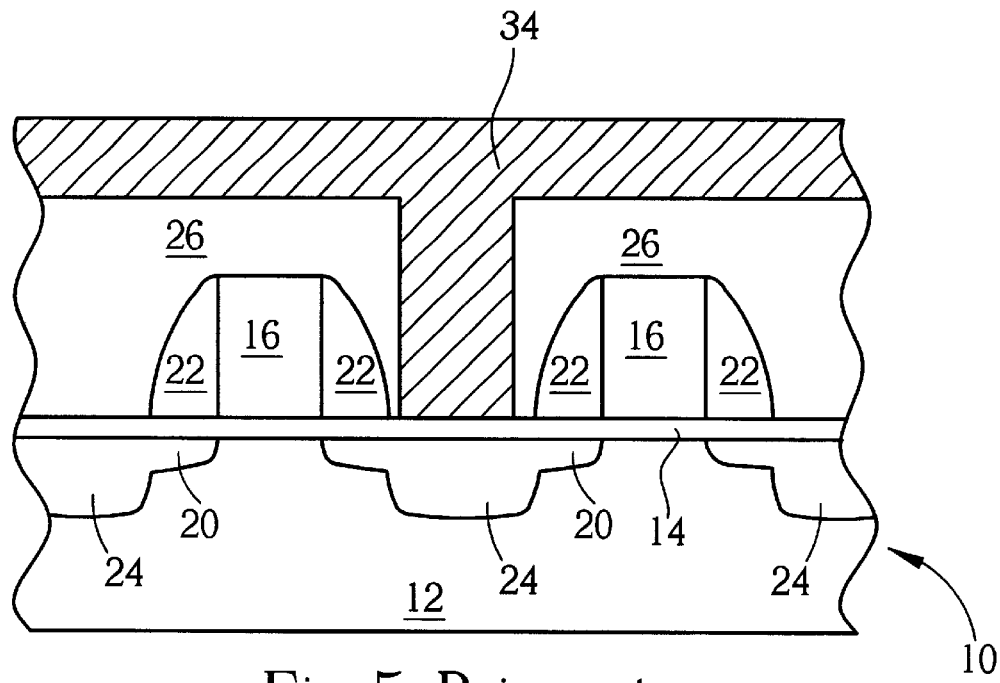
Figure 6:
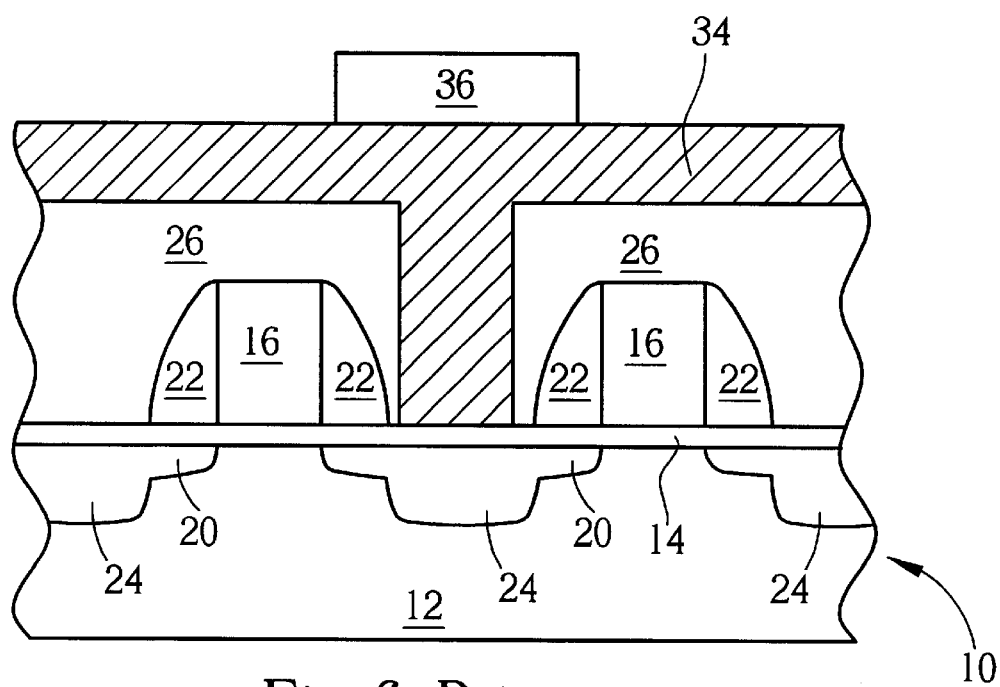
Figure 7:
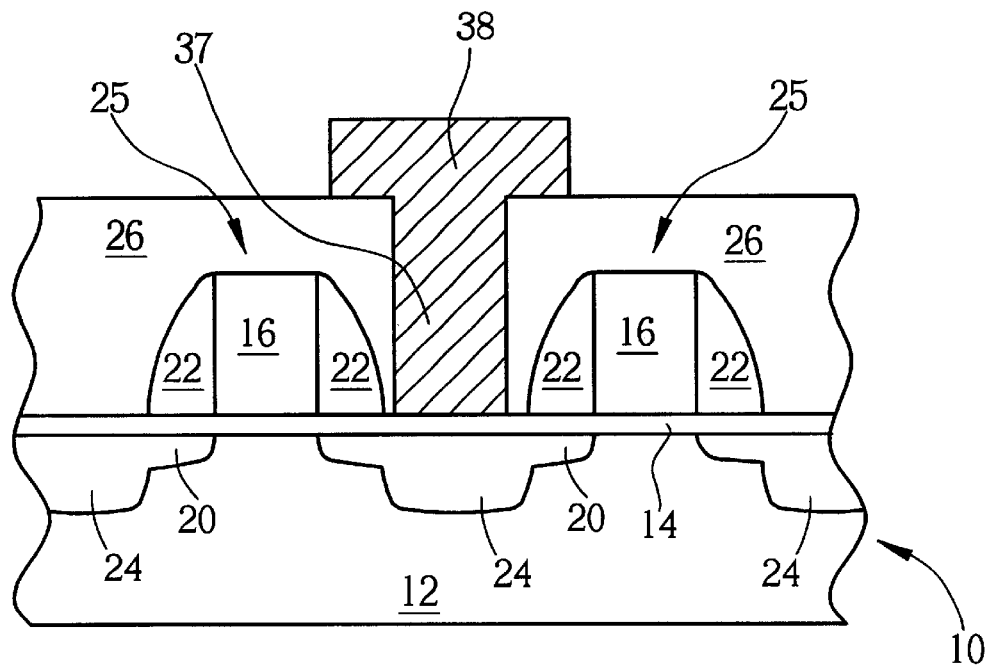
Figure 8:
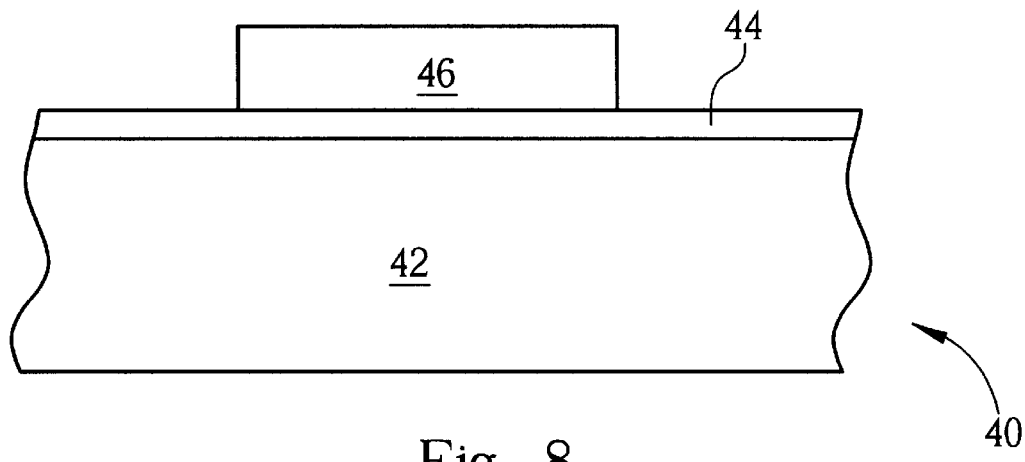
FIG. 8 to FIG. 17 are schematic diagrams of a method of forming a MOS transistor according to the present invention.
Figure 9:
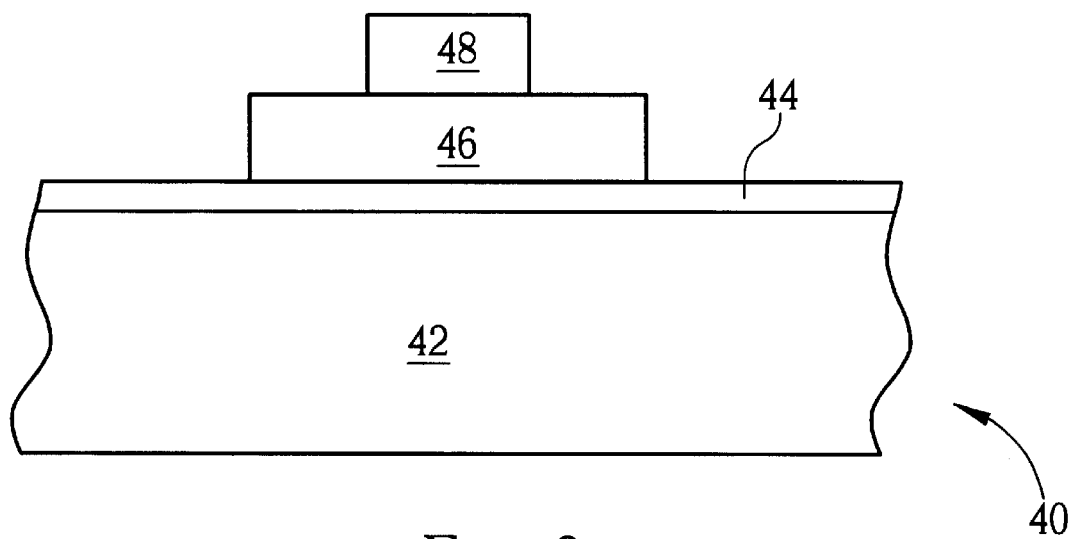
Figure 10:
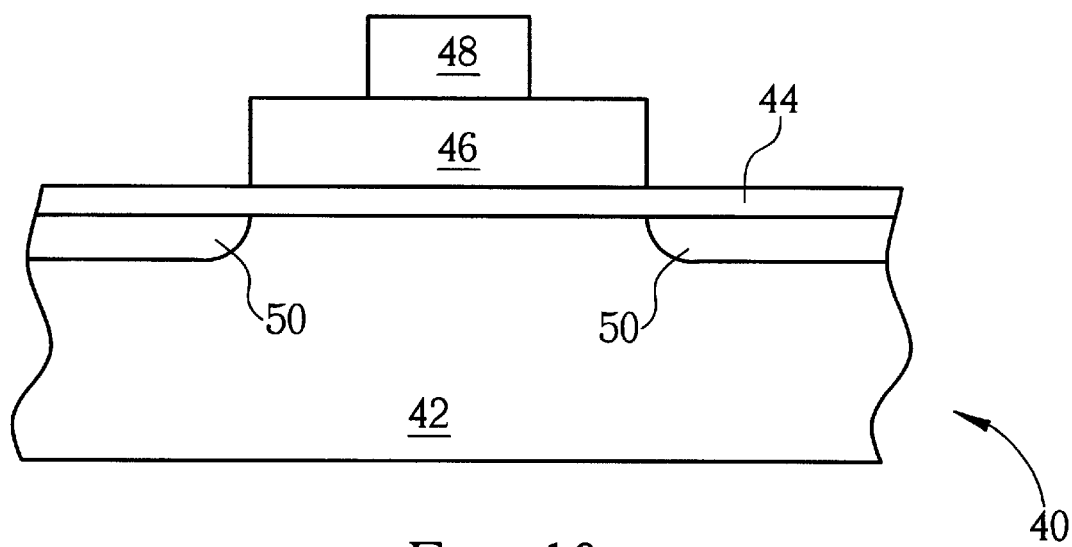

As shown in FIG. 8, a silicon oxide layer 44 is first formed on the silicon substrate 42 and then a polysilicon layer 46 is formed on a predetermined area of the silicon oxide layer 44. Next, as shown in FIG. 9, a first dielectric layer 48 made of silicon nitride is formed on top of the polysilicon layer 46. Then, as shown in FIG. 10, an ion implantation process is performed to form two lightly doped areas 50 in the silicon substrate 42 on two opposite sides of the polysilicon layer 46 wherein each of the two lightly doping areas 50 is used as a lightly doped drain (LDD).

Figure 11:
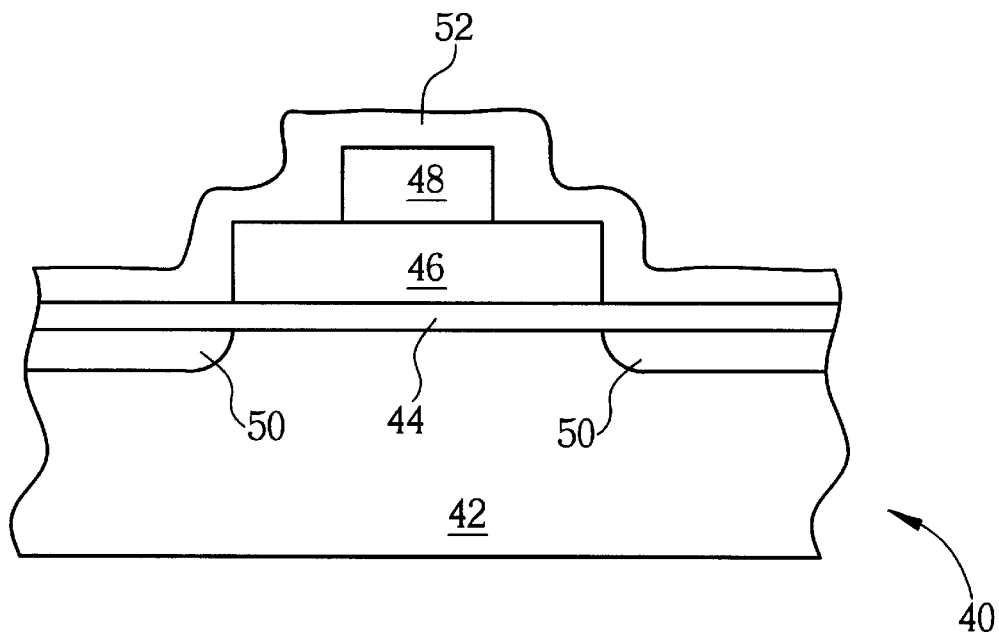
Figure 12:
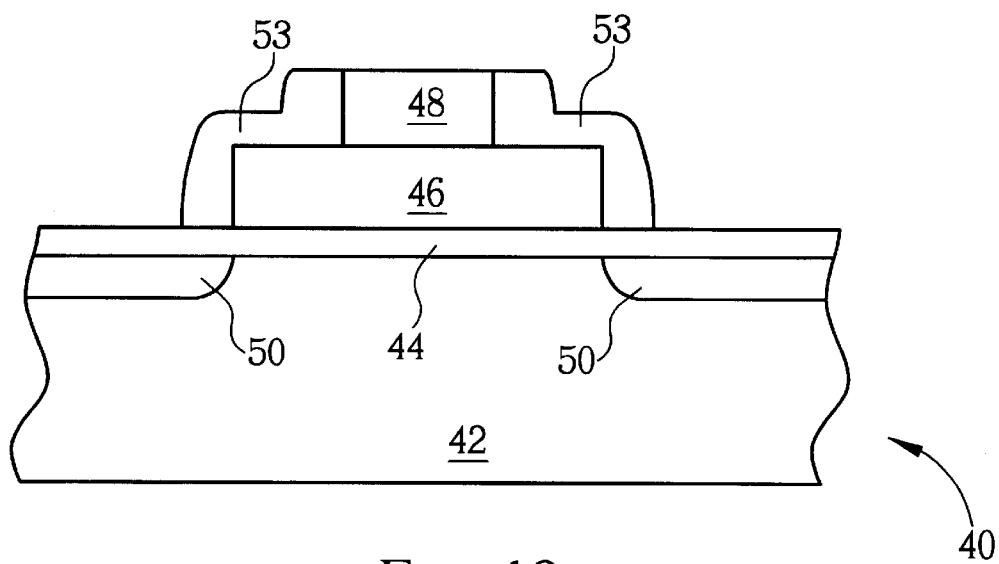

Then, as shown in FIG. 11, a second dielectric layer 52 made of silicon oxide is uniformly covered onto the surface of the silicon oxide layer 44, the polysilicon layer 46, and the first dielectric layer 48. Next, as shown in FIG. 12, an etching back process is performed which completely removes the second dielectric layer 52 positioned on top of the first dielectric layer 48 and also removes layer 52 from the silicon oxide layer 44 where it is not near the periphery of the polysilicon layer 46. Hence, the remaining second dielectric layer 52 positioned around the periphery of the polysilicon layer 46 and the first dielectric layer 48 becomes a spacer 53.

Figure 13:
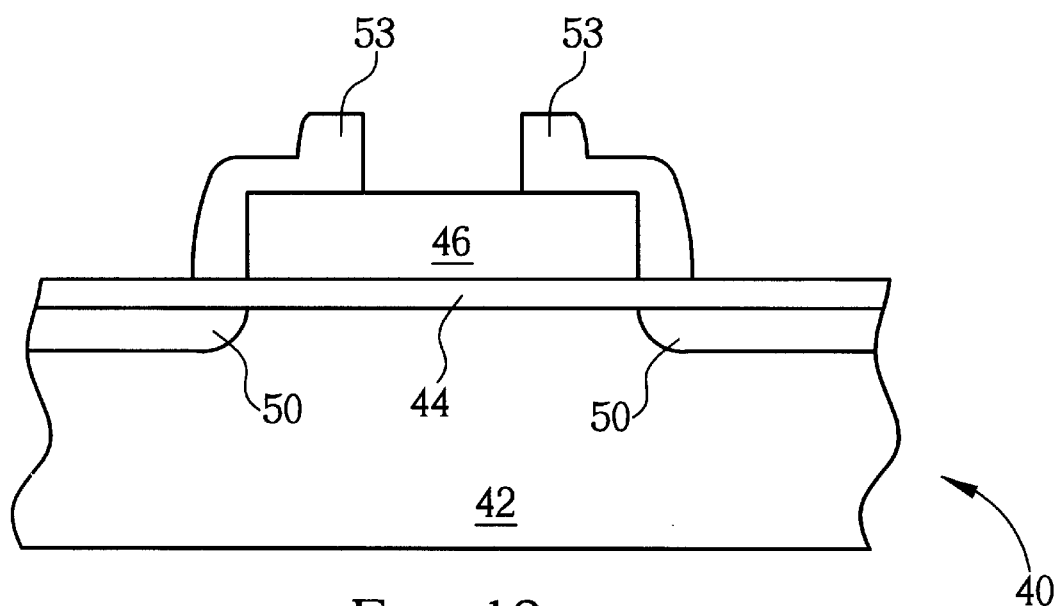
Figure 14:
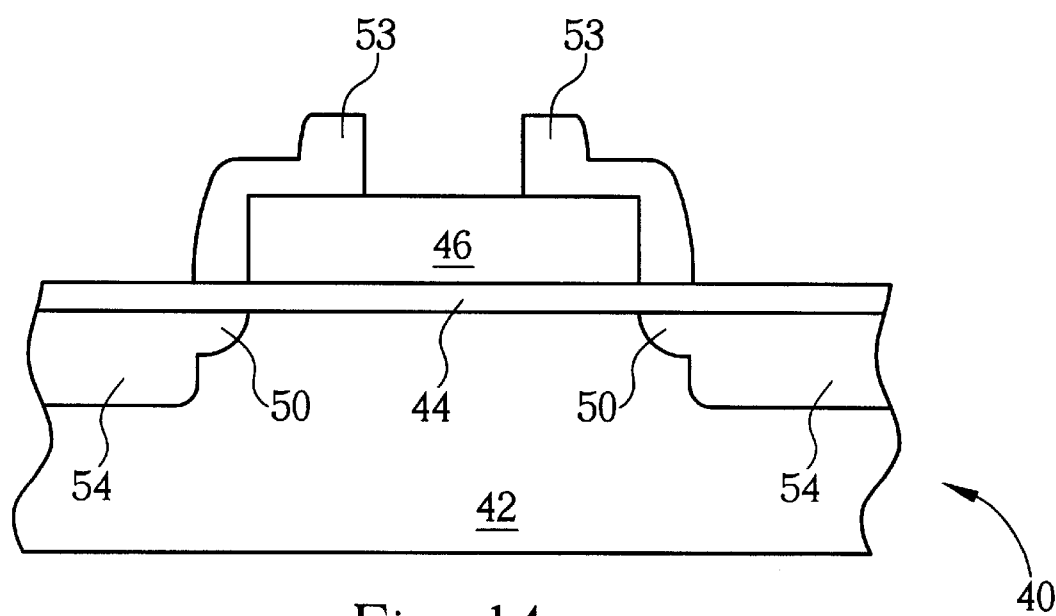

Next, as shown in FIG. 13, an etching process is performed to completely remove the first dielectric layer 48. Then, as shown in FIG. 14, an ion implantation process is performed to form two doping areas 54 in the silicon substrate 42 adjacent to the spacers 53. These two doping areas serve as a source and a drain 54 of the MOS transistor.

Figure 15:
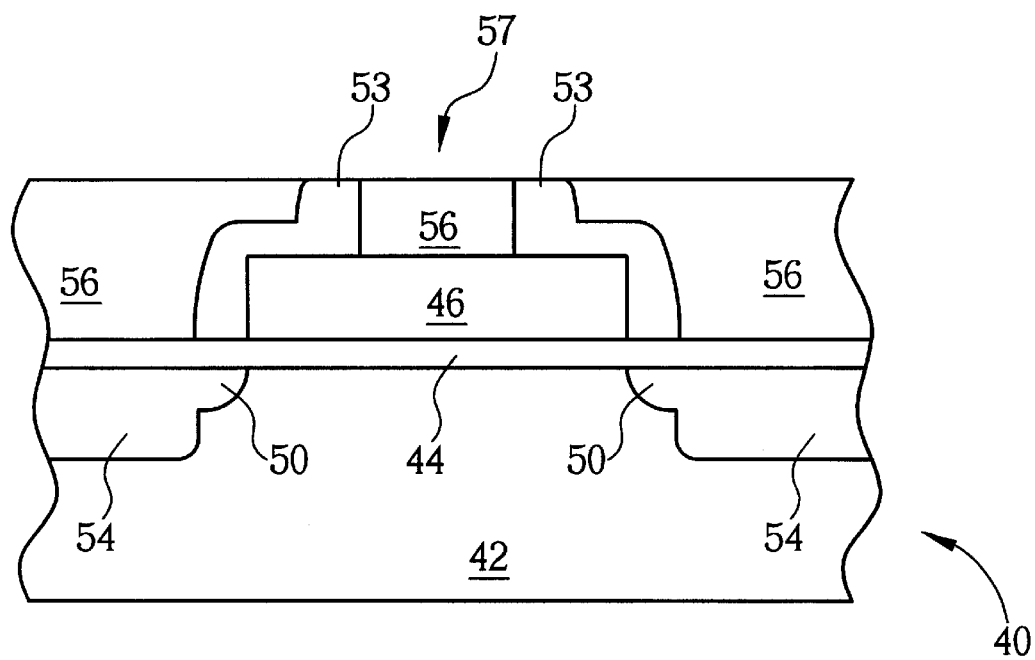

Later, as shown in FIG. 15, a conductive layer 56 is uniformly formed on the semiconductor wafer 40 that fills the space between the spacers 53. The conductive layer 56 is made of an amorphous silicon layer, a polysilicon layer or an epitaxy layer. Then a chemical mechanical polishing (CMP) planarization process is performed to level off the surface of the conductive layer 56 and to isolate the conductive layer 56 positioned inside the spacers 53 from that positioned outside the spacers. The conductive layer 56 and the polysilicon layer 46 positioned inside the spacers 53 are used as a gate 57 of a MOS transistor. An ion implantation process is performed to implant IIIA-group dopants, such as boron (B), or VA-group dopants, such as arsenic (As), into the conductive layer 56 to reduce its resistance.

Figure 16:
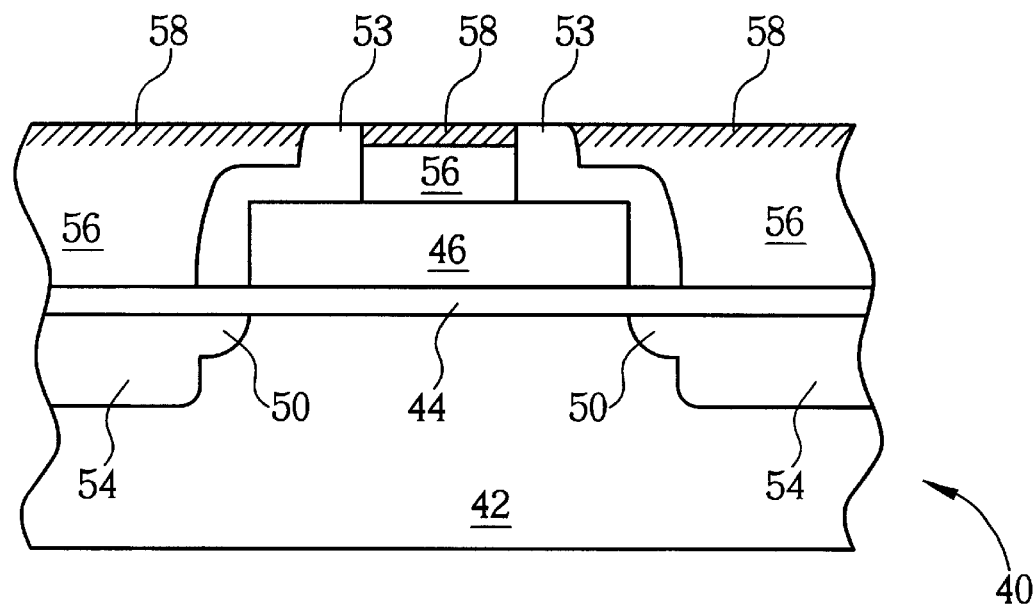

Next, as shown in FIG. 16, a self-aligned silicide (salicide) process is performed to form a silicide layer 58 on the conductive layer 56 to reduce the sheet resistance of the conductive layer 56. The salicide process comprises depositing a tungsten layer (not shown) on the semiconductor wafer 40 and then causing the tungsten layer and the conductive layer 56 to react under high temperatures, forming tungsten silicon that is the silicide layer 58. The unreacted tungsten is then removed.

Figure 17:
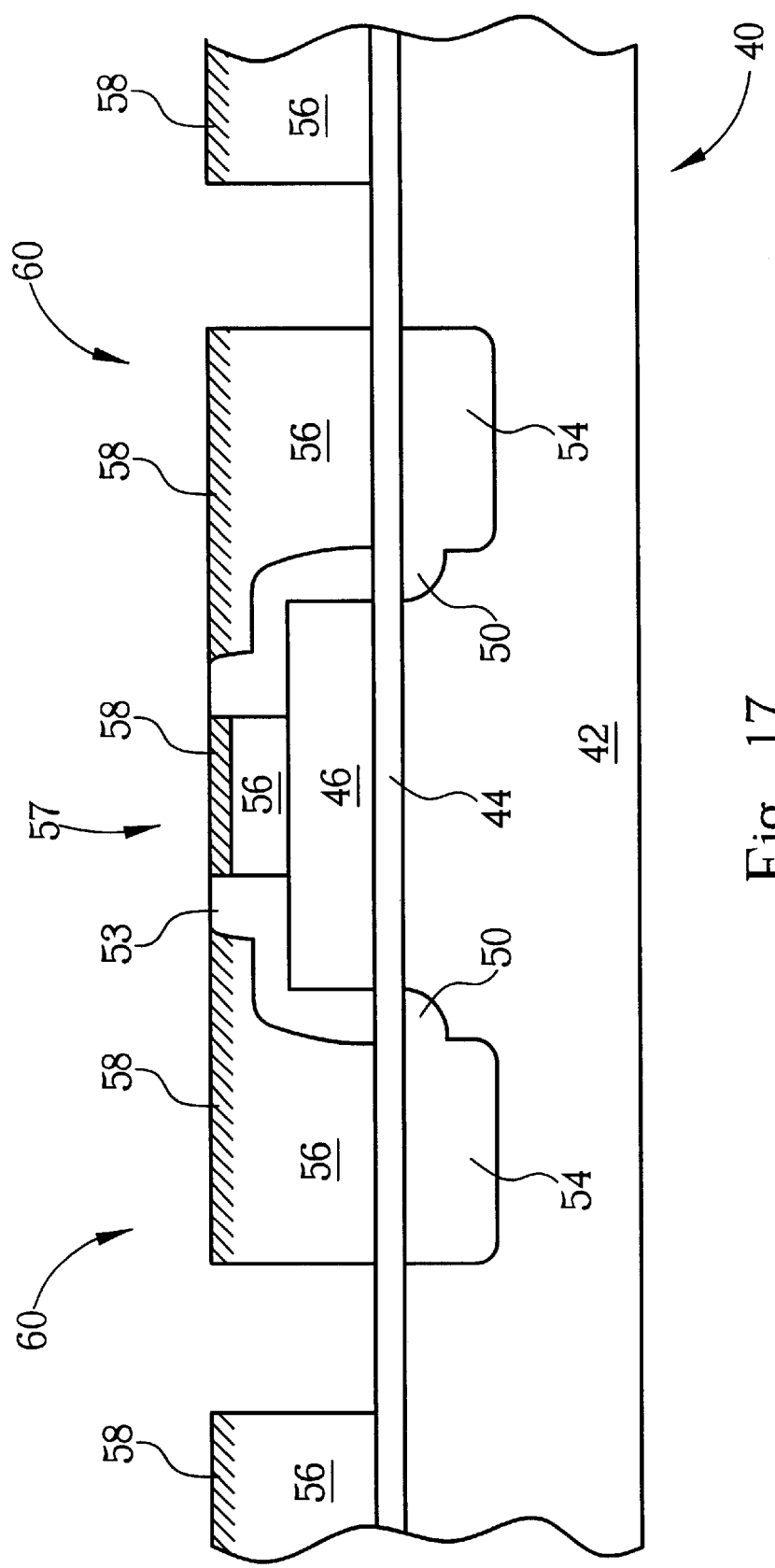

Finally, as shown in FIG. 17, a lithographic process is performed to remove the silicide layer 58 and the conductive layer 56 on a specific area of the silicon substrate 42 to isolate the MOS transistor from other devices positioned on the silicon substrate 42 and so prevent short-circuiting.

According to the above-mentioned method, silicon nitride is used to form the first dielectric layer 48 (FIG. 11) and silicon oxide is used to form the second dielectric layer 52. In practice, silicon oxide can be used to form the first dielectric layer 48 if silicon nitride is used to form the second dielectric layer 52.

In the present invention, the conductive layer 56 and the polysilicon layer 46 positioned inside the spacers 53 are used as the gate 57, and the conductive layer 56 and the silicide layer 58 positioned outside the spacers 53 are used as the landing pad 60. The gate 57 and the landing pad 60 are formed at almost the same time and the position of the landing pad 60 can be defined without performing the lithographic process twice. This not only makes the whole semiconductor process simpler and more easily controlled, but it is also less damaging to the integrity of the semiconductor wafer 40.

Compared to the prior method of forming the MOS transistor 25 and the landing pad 38, in the present invention method of forming the MOS transistor the gate 57 of the MOS transistor and the landing pad 60 on the source and drain of the MOS transistor are formed at the same time. Also, the whole semiconductor process is simplified to ensure the electrical performance of the semiconductor products.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method of forming a metal oxide semiconductor (MOS) transistor on a semiconductor wafer, the semiconductor wafer comprising a silicon substrate, the method comprising:

forming a silicon oxide layer on the silicon substrate;

forming a polysilicon layer on a predetermined area of the silicon oxide layer and a first dielectric layer on top of the polysilicon layer;

forming a second dielectric layer uniformly covered on the surface of the silicon oxide layer, the polysilicon layer and the first dielectric layer;

performing an etching back process to completely remove the second dielectric layer positioned on top of the first dielectric layer and to make the second dielectric layer positioned around the periphery of the polysilicon layer and the first dielectric layer become a spacer;

performing an etching process to completely remove the first dielectric layer surrounded by the spacer;

performing an ion implantation process to form two doping areas on the silicon substrate at two opposite sides of the spacer which are respectively used as a source and a drain of the MOS transistor;

forming a conductive layer uniformly on the semiconductor wafer which fills the space inside the spacer; and performing a planarization process to level off the surface of the conductive layer and to make the conductive layer positioned inside and outside the spacer become isolated wherein the conductive layer and the polysilicon layer positioned inside the spacer are used as a gate of the MOS transistor.

2. The method of claim 1 wherein the MOS transistor is formed on a predetermined area of the silicon substrate and the method further comprises a step following the planarization process:

removing the conductive layer positioned around the predetermined area of the silicon substrate for isolating the MOS transistor from other devices positioned on the silicon substrate and isolating the conductive layer positioned above the drain from that positioned above the source over which the conductive layers positioned on the drain and the source are used as a landing pad of the drain and the source respectively.

3. The method of claim 2 wherein the MOS transistor is a pass transistor of a memory cell of a dynamic random access memory (DRAM), and the top end of the landing pad is used for electrically connecting a storage node of a capacitor of the memory cell or a bit line of the DRAM.

4. The method of claim 1 further comprises:

performing an ion implantation process prior to the formation of the second dielectric layer to form two doping areas on the silicon substrate at two opposite sides of the polysilicon layer wherein each of the two doping areas is used as a lightly doped drain (LDD) of the MOS transistor.

5. The method of claim 1 wherein the planarization process is a chemical mechanical polishing (CMP) process.

6. The method of claim 1 wherein the first dielectric layer is formed by silicon oxide ($SiO_2$) and the second dielectric layer is formed by silicon nitride (SiN).

7. The method of claim 1 wherein the first dielectric layer is formed by silicon nitride and the second dielectric layer is formed by silicon oxide.

8. The method of claim 1 wherein the conductive layer is a polysilicon layer or an epitaxy layer.

9. The method of claim 8 wherein the conductive layer comprises IIIA-group or VA-group dopants for reducing the resistance of the conductive layer.

10. The method of claim 9 wherein the IIIA-group dopant is boron (B) and the VA-group dopant is arsenic (As).

11. The method of claim 10 wherein a silicide layer is further positioned on the conductive layer for reducing the sheet resistance of the conductive layer.

12. The method of claim 11 wherein the silicide layer is formed by tungsten silicon ($WSi_x$).

* * * * *